(12) United States Patent
Walters

(10) Patent No.: US 9,618,582 B2
(45) Date of Patent: Apr. 11, 2017

(54) SYSTEM AND METHOD OF ELECTRIC MOTOR FAULT DETECTION

(71) Applicant: DELPHI TECHNOLOGIES, INC., Troy, MI (US)

(72) Inventor: James E. Walters, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 343 days.

(21) Appl. No.: 14/528,074

(22) Filed: Oct. 30, 2014

(65) Prior Publication Data

US 2016/0124049 A1 May 5, 2016

(51) Int. Cl.
*G01R 31/34* (2006.01)
*H02P 6/00* (2016.01)
*G01R 31/02* (2006.01)

(52) U.S. Cl.
CPC ........... *G01R 31/34* (2013.01); *G01R 31/024* (2013.01); *H02P 6/001* (2013.01); *G01R 31/343* (2013.01)

(58) Field of Classification Search
CPC G01R 31/26; G01R 31/2642; G01R 31/2648; G01R 31/2831; G01R 31/31702; G01R 31/40; G01R 31/42
See application file for complete search history.

(56) References Cited

U.S. PATENT DOCUMENTS

| | | | |
|---|---|---|---|
| 4,744,041 A | 5/1988 | Strunk et al. | |
| 5,049,815 A | 9/1991 | Kliman | |
| 5,420,523 A | 5/1995 | Walker et al. | |
| 5,461,329 A * | 10/1995 | Linehan | G01R 31/343 324/765.01 |
| 5,880,415 A | 3/1999 | Colby et al. | |
| 5,886,498 A | 3/1999 | Sul et al. | |
| 6,066,934 A | 5/2000 | Kaitani et al. | |
| 6,473,657 B1 | 10/2002 | Moriarty | |
| 8,164,298 B2 * | 4/2012 | Anwar | G01R 31/025 318/430 |
| 2004/0162704 A1 | 8/2004 | Siegel et al. | |
| 2007/0008666 A1 * | 1/2007 | Morita | B60L 3/0023 361/42 |
| 2010/0295491 A1 | 11/2010 | Schulz et al. | |
| 2011/0282605 A1 | 11/2011 | Shimizu | |

FOREIGN PATENT DOCUMENTS

EP 2 693 226 A1 2/2014
EP 2 719 606 A1 4/2014

* cited by examiner

*Primary Examiner* — Tung X Nguyen
(74) *Attorney, Agent, or Firm* — Lawrence Hazelton

(57) ABSTRACT

A system for detecting faults in a motor includes a drive circuit, a detection circuit, and a controller. The drive circuit is configured to apply a drive signal to a motor. The detection circuit is configured to detect a response signal generated when the drive signal is applied to the motor. The controller is configured to determine a motor fault based on a comparison of the response signal to an expected signal for the drive signal applied to the motor. The drive signal is selected to generate a rotating magnetic field in the motor with a rotation-frequency greater than a maximum mechanical-response-frequency of the motor.

19 Claims, 4 Drawing Sheets

SYSTEM AND METHOD OF ELECTRIC MOTOR FAULT DETECTION

TECHNICAL FIELD OF INVENTION

This disclosure generally relates to a system for detecting electrical faults in a motor, and more particularly relates to applying a drive signal selected to generate a rotating magnetic field in the motor with a rotation-frequency greater than a maximum mechanical-response-frequency of the motor.

BACKGROUND OF INVENTION

It is known to equip a vehicle with an electric drive actuator or motor for providing torque to the engine/driveline/wheels, and optionally generating electricity when mechanically driven. Various failure modes of the motor include internal shorts or opens of phases in the motor. Before the motor is used by the vehicle, it is advantageous to test the motor without actually operating the motor. In addition, it is advantageous to track key motor characteristics over time to detect degradation before a significant failure occurs. Techniques to detect opens and shorts have been proposed that operate the motor (e.g. attempt to generate torque) and then detect faults such as over currents, controller faults associated with lack of control of the motor, or plausibility checks on two currents being equal and opposite or all zero indicating an open phase. These faults can have a variety of potential causes that are not related to faults in the motor. For instances, two currents being equal and opposite is a natural condition that occurs every sixty degrees of rotation and may exist continuously during stall. Controller faults can be related to current sensors or gate signals not functioning correctly. Furthermore, these checks can lack fidelity and allow a degrading machine to not be correctly identified until a significant fault occurs, which can result in a stranded operator of the vehicle.

SUMMARY OF THE INVENTION

In accordance with one embodiment, a system for detecting faults in a motor is provided. The system includes a drive circuit, a detection circuit, and a controller. The drive circuit is configured to apply a drive signal to a motor. The detection circuit is configured to detect a response signal generated when the drive signal is applied to the motor. The controller is configured to determine a motor fault based on a comparison of the response signal to an expected signal for the drive signal applied to the motor. The drive signal is selected to generate a rotating magnetic field in the motor with a rotation-frequency greater than a maximum mechanical-response-frequency of the motor.

In another embodiment, a method of detecting faults in a motor is provided. The method includes the step of applying a drive signal to a motor. The method also includes the step of detecting a response signal that arises when the drive signal is applied to the motor. The method also includes the step of determining a motor fault based on a comparison of the response signal to an expected signal for the drive signal applied to the motor. The drive signal is selected to generate a rotating magnetic field in the motor with a rotation-frequency greater than a maximum mechanical-response-frequency of the motor.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
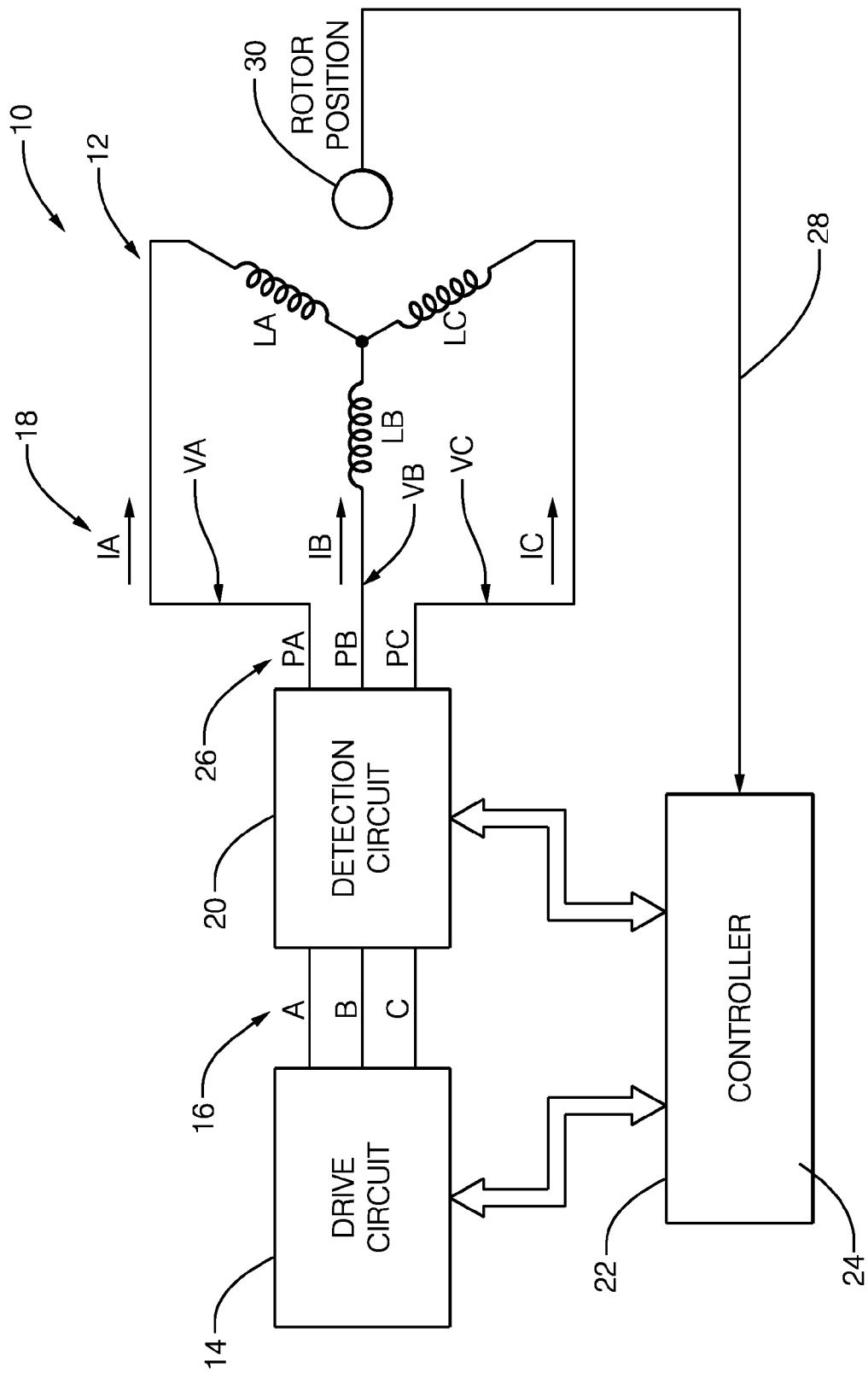
FIG. 1 is a diagram of system for detecting faults in motors in accordance with one embodiment.

FIG. 1 illustrates a non-limiting example of a system 10 for detecting faults in an electric motor, hereafter the motor 12. The system 10 described herein was conceived while developing ways to test electric motors used in vehicles such as automobiles. However, it is recognized that the system 10 described herein could be used in non-automotive applications such as industrial applications. The motor 12 is depicted as similar to a three-phase brushless motor, presumably with a permanent magnet rotor. However, the teachings presented herein are applicable to other types of motors such as inductance, synchronous reluctance, and wound field synchronous motors, and with a number of phases other than three, as will be recognized by those in the art.

The system 10 includes a drive circuit 14 configured to apply a drive signal 16 to the motor 12. Typically, the drive circuit 14 would be a full-wave type drive able to apply positive and negative differential voltages to the phases 26 (PA, PB, and PC) of the motor 12. Alternatively, the drive circuit 14 may be a controlled-current type drive that is configured to inject a desired current into each of the phases 26 instead of applying a voltage onto each of the phases 26.

The system 10 includes a detection circuit 20 configured to detect a response signal 18 that arises when the drive signal 16 is applied to the motor 12. By way of example and not limitation, the response signal 18 in this example are the currents IA, IB, and IC flowing in the phases PA, PB, and PC, respectively. Alternatively, if the drive circuit 14 were a controlled-current type drive, then the detection circuit 20 may preferably be configured to determine the voltages commanded to or applied to each phase, e.g. VA, VB, and VC. If the detection circuit 20 is configured to determine current, e.g. IA, IB, and IC, the detection circuit 20 may include, for example, a small value current sense resistor for each phase, or Hall-effect type current sensors, as will be recognized by those in the art.

The system 10 includes a controller 22 configured to determine a motor fault based on a comparison of the response signal 18 to an expected signal 24 for the drive signal 16 applied to the motor 12. The response signal 18 is reported to the controller 22 by the detection circuit 20 as illustrated, and the drive signal 16 is output by the drive circuit 14 in response to control signals from the controller 22. The controller 22 may include a processor (not shown) such as a microprocessor or other control circuitry such as analog and/or digital control circuitry including an application specific integrated circuit (ASIC) for processing data as should be evident to those in the art. The controller 22 may include memory, including non-volatile memory, such as electrically erasable programmable read-only memory (EEPROM) for storing one or more routines, thresholds, captured data, and the expected signal 24. The one or more routines may be executed by the processor to perform steps for determining if signals received by the controller 22 indicate that there is a fault (i.e. functional problem) with the motor 12 as described herein. The motor fault may be indicated to an operator of a vehicle via, for example, a message displayed on a driver information center, or by illuminating an icon on an instrument panel of the vehicle.

The system 10 may include a rotor angular position sensor, hereafter the angle sensor 30, configured to provide an angle signal 28 to the controller 22 indicative of the angle of the rotor (not shown) relative to the windings (not shown) or stator (not shown) of the motor 12, as will be recognized by those in the art. The angle signal 28 may be used to determine or compensate the expected signal 24, which can be recalled from memory by the controller 22, or may be determined (i.e. estimated or calculated) by the controller 22 as a function of the angle signal 28. That is, the response signal 18 that is generated in response to the drive signal 16 being applied to the motor 12 is influenced by the angular position of the rotor relative to the windings or stator of the motor 12. As such, the angle signal 28 is useful to adjust what the expected signal 24 is supposed to be, and thereby provide a better reference for comparison to the response signal 18 by the controller 22. Alternatively, the response signal can be calculated using the angular position in order to create a response signal that is fixed for different rotor positions and thus be compared to a constant expected result. Furthermore, the detection circuit may provide signals to the controller 22 that can be further modified before a comparison is made to the expected result 24.

The system 10 described herein overcomes the short comings of the prior attempts to perform motor tests by performing a diagnostic test prior to using the motor 12 to generate any substantive torque. The diagnostic test described herein may be performed during, for example, initial power-up of the system 10. In general, the diagnostic test advantageously applies normal operating voltages (e.g. 30V PWM'd from a 325V supply) to the motor 12 instead of the relatively low voltage/current test signals (e.g. 5V) suggested in the prior art. Applying normal operating voltages is advantageous as high voltages and currents may better reveal dielectric insulation breakdown in the windings of the motor 12, and/or better reveal a localized high resistance caused by fracture fatigue in wire of the windings or terminations of the motor 12. However, in order to avoid movement of the motor, the diagnostic test is performed in a relatively short time interval, and using a drive signal that does not cause the motor to rotate.

When operating the motor 12 to generate typical torque levels, the rotational speed that the magnetic field within the motor 12 is rotated is equal to the rotor's rotation speed, and at a specific phase relative to the rotor's field-dictated by the desired torque, desired efficiency, and motor characteristics. If a rotor is not rotating (i.e. not moving), and a rotating magnetic field with a sufficiently high rotational speed is applied to the motor 12, the average torque will be substantially zero, with little to no rotor movement as the mechanical inertia will effectively filter out the alternating component of the torque. As such, a test may be performed if the drive signal 16 is selected to generate a rotating magnetic field in the motor 12 with a rotation-frequency 202 (FIG. 2) greater than a maximum mechanical-response-frequency of the motor 12. As used herein, the term 'rotation-frequency' refers to the frequency at which the magnetic field produced by the winding of the motor is rotated by applying AC voltages of the same frequency to each phase of the motor, which can differ from the rotor's rotational speed because of the design of the motor. Furthermore, the maximum mechanical-response-frequency is a value of the rotation-frequency 202 (FIG. 2) where any incremental movement of the motor 12 does not influence the load to which the motor 12 is coupled and the response signal 18 is also not influenced. That is, the motor 12 is effectively stalled when the rotation-frequency 202 is greater than a maximum mechanical-response-frequency of the motor 12 even though the amplitude of the drive signal 16 is similar to the amplitude used to operate the motor 12 when the rotation-frequency 202 is lower. The maximum mechanical-response-frequency may be determined by empirical testing and/or computer modeling, and may take into consideration the expected mechanical load on the motor 12.

Figure 2:
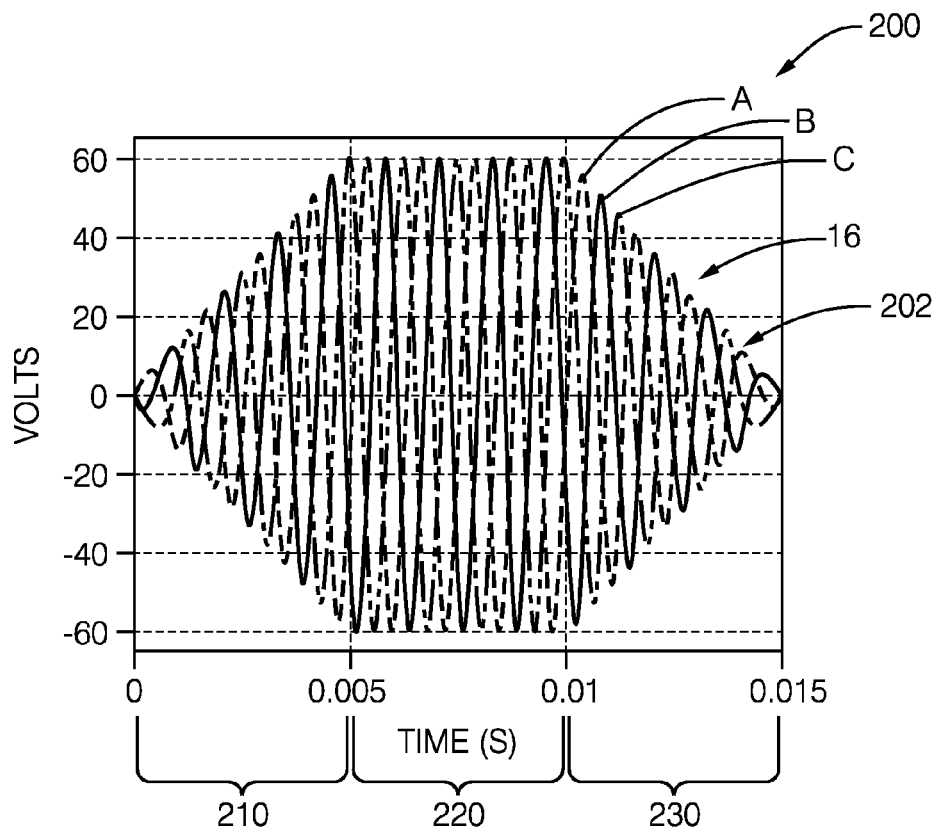
FIG. 2 is a graph of a signal present in the system of FIG. 1 in accordance with one embodiment.

FIG. 2 illustrates a non-limiting example of a graph 200 of the drive signal 16 that is suitable for testing the motor 12. In this example, the rotation-frequency 202 of the drive signal 16 illustrated in FIG. 2 is about eight-hundred Hertz (800 Hz). The sinusoidal currents are developed by providing a ramped sinusoidal voltage to the motor 12 so as not to needlessly excite transient currents which could negatively impact the phase current measurements by requiring prohibitively long time periods to reach steady state. The drive signal 16 is typically generated by a pulse-width-modulation (PWM) pattern at, for example, ten-thousand Hertz (10 kHz), but only the underlying 800 Hz fundamental signal content is shown. That is, the drive signal 16 shown in FIG. 2 does not show the PWM signal used to generate the drive signal 16, which would have a much higher frequency than what is illustrated. As suggested before, a current regulator could still be used to drive the currents, though care must be taken to ensure proper protection if one phase is partially shorted or opened.

The graph 200 of the drive signal 16 includes a ramp-up portion 210 after the drive signal 16 starts at time 0 seconds, a ramp-down 220 portion before the drive signal 16 ends at time 0.015 seconds, and a test portion 230 between the ramp-up portion 210 and the ramp-down portion 220. The test portion 230 is between time 0.005 seconds and 0.010 seconds. The ramp rates of drive signal 16 during the ramp-up portion and the ramp-down portion are configured or selected to reduce or avoid current transients that can cause radiated or conducted emissions in excess of desired emission levels, which may be set by vehicle manufactures and/or government agencies and would unnecessarily cause the test portion time to be increased. If the ramp rates are too slow, then the total test time for the diagnostic test performed by applying the drive signal 16 may be unacceptably long, causing an unacceptable delay before the motor 12 is available for operation to generate torque.

As suggested above, one embodiment of the system 10 described herein has the detection circuit 40 configured to measure current (e.g. IA, IB, IC) flowing in one or more phases 26 of the motor 12, and the response signal 18 is based on current flowing in one or more phases of the motor 12 during the test portion 230 of the drive signal 16. The controller 22 may sample data from the detection circuit 20 and process that sampled data so that the response signal 18 can be characterized by a single value such as an average magnitude 304 of current flowing in a phase (e.g. PA, PB, BC) of the motor 12.

Figure 3:
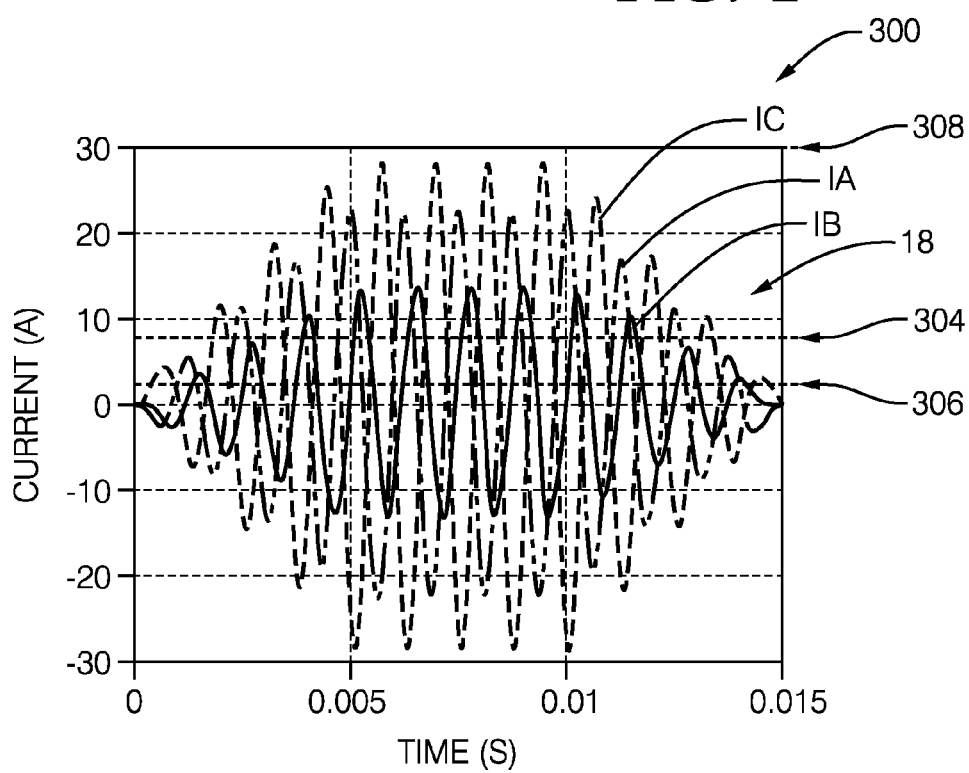
FIG. 3 is a graph of a signal present in the system of FIG. 1 in accordance with one embodiment.

FIG. 3 illustrates a graph 300 of a non-limiting example of the response signal 18 generated in response to the drive signal 16 of FIG. 2 being applied to a non-limiting example of the motor 12. Because the angular position of the rotor influences the effective inductances of each phase, there are different average magnitudes of the currents IA, IB, and IC. Accordingly, the angle signal 28 can be used by the controller 22 in order to determine an expected signal 24 for the response signal 18.

The average magnitude 304 may be determined by the controller 22 sampling data from the detection circuit 20, and calculating an algebraic average of the absolute value of any or all of the currents IA, IB, IC, or calculating a root-mean-square (RMS) value. Several options exist for detecting opens and shorts. The most basic check, which requires the least amount of processing power and also provides an identification of the specific phase in question, is to analyze the currents IA, IB, IC individually. For instance, absolute maximum/minimum or mean of the absolute value can provide sufficient information to determine if the current is of appropriate size. Currents that are too low indicate that an open-circuit or high impedance condition exists in the motor in a particular phase (PA, PB, PC). If multiple phases are open-circuit, then no current would flow, which can also be detected. Currents that are too high indicate that a short-circuit or low impedance condition exists. For extreme cases of terminal shorts, the system 10 may include overcurrent protection (not shown), as will be recognized by those in the art.

By way of further example and not limitation, the controller 22 may calculate an average current 304 in one of the phases 26 to be eight Amperes (8A). The controller 22 may be configured to indicate a motor fault if the average magnitude 304 is less than an open-circuit threshold 306, for example, two Amperes (2A). Similarly, the controller 22 may be configured to indicate a motor fault if the average magnitude is greater than a short-circuit threshold 308, for example, thirty Amperes (30A). The values selected for the open-circuit threshold 306 and the short-circuit threshold 308 may be done by empirical testing, or by engineering analysis.

Figure 4:
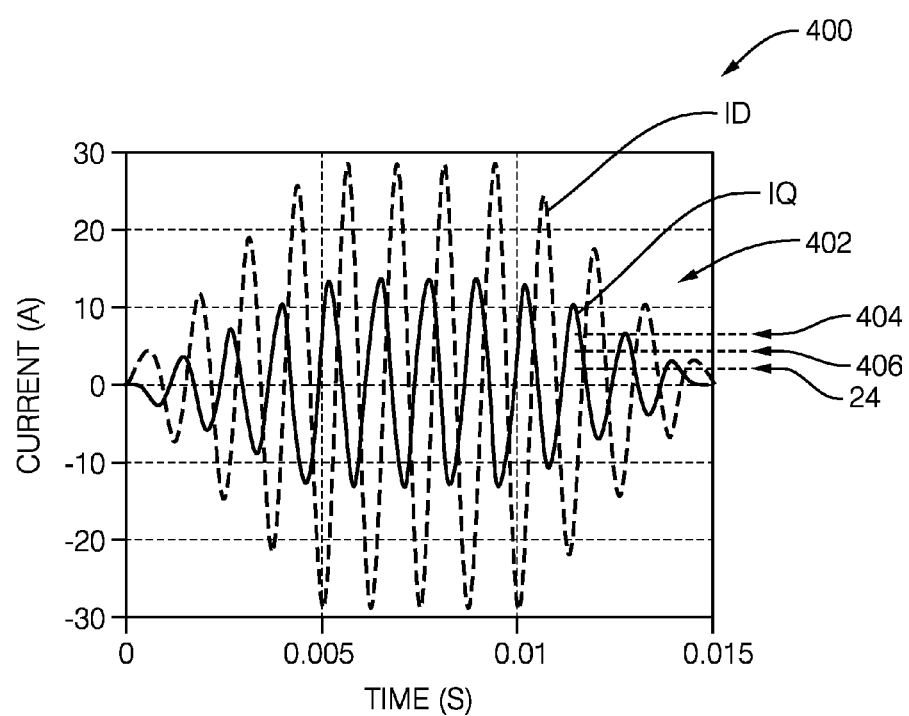
FIG. 4 is a graph of a signal present in the system of FIG. 1 in accordance with one embodiment.

FIG. 4 illustrates a graph 400 of a non-limiting example of a q-axis current IQ and a d-axis current ID derived from a transformation of the currents IA, IB, and IC by Eq. 1 in order for the characteristic currents 404 (e.g. IQ, ID) of the motor 12 to be viewed in a rotor reference frame 402.

$$\begin{pmatrix} IQ \\ ID \\ IO \end{pmatrix} = \frac{2}{3} \begin{pmatrix} \cos(\theta) & \cos(\theta - 120) & \cos(\theta + 120) \\ \sin(\theta) & \sin(\theta - 120) & \sin(\theta + 120) \\ \frac{1}{2} & \frac{1}{2} & \frac{1}{2} \end{pmatrix} \begin{pmatrix} IA \\ IB \\ IC \end{pmatrix}, \quad \text{Eq. 1}$$

where θ (i.e.—theta) is indicated by the angle signal 28.

In this non-limiting example, the response signal 18 is characterized as a characteristic current 404 derived from currents IA, IB, IC flowing in each phase PA, PB, PC of the motor 12 and the angle signal 28. The characteristic current may be indicated by a value such as an average magnitude of the q-axis current IQ, eight Amperes (8A) for example. Alternatively, the d-axis current may also be used. The expected value 24 may be determined by the controller 24 recalling from memory pre-programmed values. The controller 22 may use the angle signal 28 to adjust the value recalled from memory to compensate for varying degrees of inductive coupling caused by changes in the angular position of the rotor within the motor 12. The controller 22 may be further configured to indicate a motor fault if the characteristic current 404 differs from the expected value 24 by more than a difference threshold, indicated here as the threshold 404. It is appreciated that there may also be another threshold below the characteristic current 404 in order to provide a 'window' or range of values of the characteristic current 404 does not indicate a motor fault.

The controller may also be configured to determine a present inductance value (e.g. LA, LB, LC; FIG. 1) of a phase (PA, PB, PC) of the motor 12 based on the response signal 18 during the test portion 230 of the drive signal 18. The present inductance value LA may be calculated based upon a phase difference between the drive signal A (i.e. VA), the current IA, and the rotation frequency 202, as will recognized by those in the art, or the relationship of voltage to current amplitude through an inductor. The amplitude of the current can be easily found based on a minimum value and a maximum value of the rotor reference frame's DQ current flowing in the motor during the test portion 230 of the drive signal 16. The expected value 24 for any calculated present inductance value may be a baseline inductance value that is a preprogrammed value programmed into the controller 22 at the time the controller 22 was manufactured, or a learned value based on inductance values calculated and stored when the controller 22 and other electronics were initially connected to the motor 12. Alternatively, an inductance value of the motor 12 may be based on inductance values indicated in alternative reference frames such as the rotor reference frame 402 or the stator reference frame (not shown).

As such, the controller 22 is configured to compare the present inductance value LA, LB, LC to a baseline inductance value, and indicate a motor fault if the present inductance differs from the baseline inductance value by more than an inductance change threshold. For example, if the present inductance LA is determined to be ten-point-five milli-Henrys (10.5 mH), and the expected value 24 is 10.0 mH based on a baseline value of 10.0 mH for the rotor angle indicated by the angle signal 28, and the inductance change threshold is 0.3 mH, then since the present inductance LA differs from the expected value by more than the inductance change threshold, a motor fault should be indicated because the inductance value has changed too much.

Figure 5:
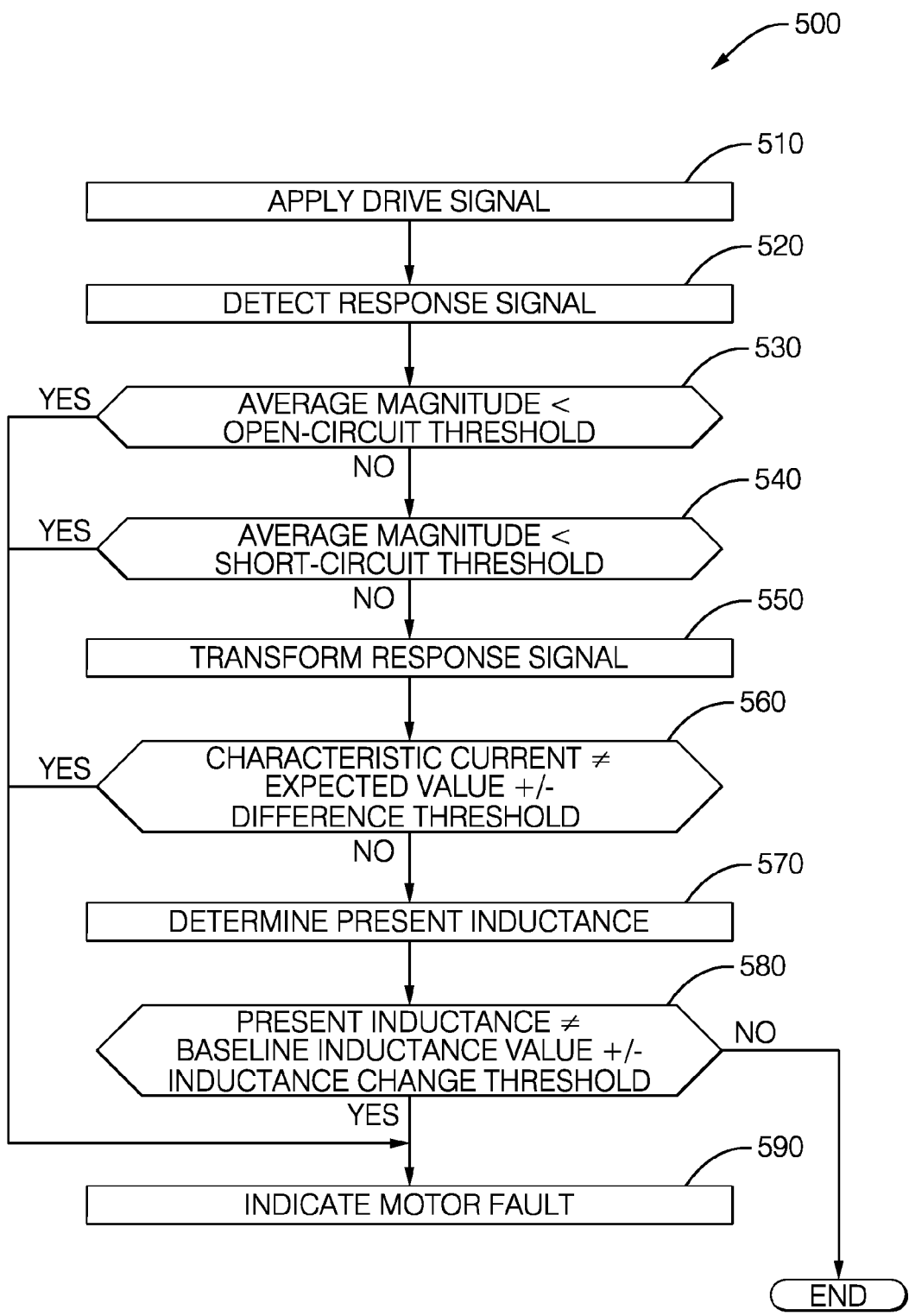
FIG. 5 is a flowchart of a method of operating the system of FIG. 1 in accordance with one embodiment.

FIG. 5 illustrates a non-limiting example of a method 500 of detecting faults in a motor 12. The method 500 may be initiated (START) when the controller 22 first receives power, and if all of the tests are passed (END) then the method 500 indicates that no motor faults have been detected.

Step 510, APPLY DRIVE SIGNAL, may include applying a drive signal 16 to the motor 12. As suggested above, the drive signal 16 is selected to generate a rotating magnetic field in the motor 12 with a rotation-frequency 202 greater than a maximum mechanical-response-frequency of the motor 12.

Step 520, DETECT RESPONSE SIGNAL, may include detecting a response signal 18 that arises when the drive signal 16 is applied to the motor 12.

Steps 530-580 describe various ways of determining a motor fault based on a comparison of the response signal 18 to an expected signal 24 for the drive signal 16 applied to the motor 12. Preferably, the response signal defines or used to calculate an average magnitude 304 of current flowing in a phase of the motor 12. It should be recognized that open-circuit, short-circuit, and other fault conditions can be determined for an individual phase of the motor 12 or various groups of the phases 26.

Step 530, AVERAGE MAGNITUDE<OPEN-CIRCUIT THRESHOLD, may include indicating a motor fault by jumping to step 590 if the average magnitude is less than the open-circuit threshold.

Step 540, AVERAGE MAGNITUDE>SHORT-CIRCUIT THRESHOLD, may indicating a motor fault by jumping to step 590 if the average magnitude is greater than the short-circuit threshold.

Step 550, TRANSFORM RESPONSE SIGNAL, may include transforming the detected currents IA, IB, IC into a rotor reference frame by applying Eq. 1 above so that the response signal 18 defines a characteristic current derived from currents flowing in each phase of the motor 12.

Step 560, CHARACTERISTIC CURRENT≠EXPECTED VALUE+/−DIFFERENCE THRESHOLD, may include indicating a motor fault if the characteristic current differs from the expected value 24 by more than a difference threshold, e.g. the threshold 404.

Step 570, DETERMINE PRESENT INDUCTANCE, may include determining a present inductance value LA, LB, LC of a phase PA, PB, PC of the motor 12 based on the response signal 18.

Step 580, PRESENT INDUCTANCE≠BASELINE INDUCTANCE VALUE +/−INDUCTANCE CHANGE THRESHOLD, may include indicating a motor fault by jumping to step 590 if the present inductance differs from a baseline inductance value by more than an inductance change threshold.

In summary, if the outcome of all of the tests is NO, then no motor fault is detected, so the method 500 ends (END) and the motor 12 is believed to be functional. However, if the outcome of any of the tests is YES (i.e. the test is not passed), then a motor fault is detected and the method proceeds to step 590

Step 590, INDICATE MOTOR FAULT, may include activating a warning light viewable by an operator of the vehicle, and/or initiating a reduced torque mode for operating the motor 12 to avoid a complete failure of the motor 12 if possible.

Accordingly, a system 10, a controller 22 for the system 10, and a method 500 of detecting faults in a motor is provided. Full voltage test signals are applied to the motor instead of reduced voltage test signals so dielectric breakdown and other faults can be more readily detected. The drive signal 16 is configured so that the motor 12 does not move even though the drive signal 16 is applying full operation voltages.

While this invention has been described in terms of the preferred embodiments thereof, it is not intended to be so limited, but rather only to the extent set forth in the claims that follow.

I claim:

1. A system for detecting faults in a motor, said system comprising:
   a drive circuit configured to apply a drive signal to a motor;
   a detection circuit configured to detect a response signal generated when the drive signal is applied to the motor; and
   a controller configured to determine a motor fault based on a comparison of the response signal to an expected signal for the drive signal applied to the motor, wherein the drive signal is selected to generate a rotating magnetic field in the motor with a rotation-frequency greater than a maximum mechanical-response-frequency of the motor.

2. The system in accordance with claim 1, wherein the drive signal includes a ramp-up portion after the drive signal starts, a ramp-down portion before the drive signal ends, and a test portion between the ramp-up portion and the ramp-down portion.

3. The system in accordance with claim 2, wherein the ramp-up portion and the ramp-down portion are configured to reduce current transients.

4. The system in accordance with claim 1, wherein the detection circuit is configured to measure current flowing in one or more phases of the motor, and the response signal is based on current flowing in one or more phases of the motor during a test portion of the drive signal.

5. The system in accordance with claim 4, wherein the response signal is characterized as an average magnitude of current flowing in a phase of the motor.

6. The system in accordance with claim 5, wherein the controller is configured to indicate a motor fault if the average magnitude is less than an open-circuit threshold.

7. The system in accordance with claim 5, wherein the controller is configured to indicate a motor fault if the average magnitude is greater than a short-circuit threshold.

8. The system in accordance with claim 4, wherein the response signal is characterized as a characteristic current derived from currents flowing in each phase of the motor.

9. The system in accordance with claim 8, wherein the controller is configured to indicate a motor fault if the characteristic current differs from the expected value by more than a difference threshold.

10. The system in accordance with claim 9, wherein the characteristic current is based on a transformation of the currents into a rotor reference frame.

11. The system in accordance with claim 1, wherein the controller is configured to determine a present inductance value of a phase of the motor based on the response signal during a test portion of the drive signal.

12. The system in accordance with claim 11, wherein the present inductance value is determined based on a minimum value and a maximum value of current flowing in the phase of the motor during the test portion of the drive signal.

13. The system in accordance with claim 11, wherein the controller is configured to compare the present inductance value to a baseline inductance value, and indicate a motor fault if the present inductance differs from the baseline inductance value by more than an inductance change threshold.

14. A method of detecting faults in a motor, said method comprising:
   applying a drive signal to a motor;
   detecting a response signal that arises when the drive signal is applied to the motor; and
   determining a motor fault based on a comparison of the response signal to an expected signal for the drive signal applied to the motor, wherein the drive signal is selected to generate a rotating magnetic field in the motor with a rotation-frequency greater than a maximum mechanical-response-frequency of the motor.

15. The method in accordance with claim 14, wherein the response signal defines an average magnitude of current flowing in a phase of the motor, and the method includes indicating a motor fault if the average magnitude is less than the open-circuit threshold.

16. The method in accordance with claim 14, wherein the response signal defines an average magnitude of current flowing in a phase of the motor, and the method includes indicating a motor fault if the average magnitude is greater than the short-circuit threshold.

17. The method in accordance with claim 14, wherein the response signal defines a characteristic current derived from currents flowing in each phase of the motor, and the method includes indicating a motor fault if the characteristic current differs from the expected value by more than a difference threshold.

18. The method in accordance with claim 17, wherein the characteristic current is based on a transformation of the currents into a rotor reference frame.

19. The method in accordance with claim 14, wherein the method includes determining a present inductance value of a phase of the motor based on the response signal; and indicating a motor fault if the present inductance differs from a baseline inductance value by more than an inductance change threshold.

\* \* \* \* \*